United States Patent
Lee et al.

(10) Patent No.: US 7,514,952 B2
(45) Date of Patent: Apr. 7, 2009

(54) I/O CIRCUITRY FOR REDUCING GROUND BOUNCE AND VCC SAG IN INTEGRATED CIRCUIT DEVICES

(75) Inventors: Eng H Lee, Penang (MY); Kok W Loo, Kuala Lumpur (MY)

(73) Assignee: Altera Corporation, San Jose, CA (US)

( * ) Notice: Subject to any disclaimer, the term of this patent is extended or adjusted under 35 U.S.C. 154(b) by 157 days.

(21) Appl. No.: 11/172,568

(22) Filed: Jun. 29, 2005

(65) Prior Publication Data
US 2007/0007991 A1   Jan. 11, 2007

(51) Int. Cl.
*H03K 17/16* (2006.01)
*H03K 19/003* (2006.01)
*H03K 19/173* (2006.01)
*H03K 19/094* (2006.01)
*G06F 7/38* (2006.01)
*H01H 37/76* (2006.01)
*H01H 85/00* (2006.01)

(52) U.S. Cl. .............. 326/21; 326/33; 326/38; 326/49; 326/50; 327/525

(58) Field of Classification Search .............. 326/21
See application file for complete search history.

(56) References Cited

U.S. PATENT DOCUMENTS

| | | | | |
|---|---|---|---|---|
| 5,742,178 | A * | 4/1998 | Jenkins et al. | 326/33 |
| 6,345,380 | B1 * | 2/2002 | Bonaccio et al. | 716/12 |
| 6,577,157 | B1 | 6/2003 | Cheung et al. | |
| 2001/0006349 | A1 * | 7/2001 | Jou et al. | 326/87 |

OTHER PUBLICATIONS

"Minimizing Ground Bounce & VCC Sag," Altera Corporation White Paper, ver. 1.0 (Nov. 2001).

* cited by examiner

*Primary Examiner*—Rexford Barnie
*Assistant Examiner*—Matthew C Tabler
(74) *Attorney, Agent, or Firm*—Ropes & Gray LLP; Robert R. Jackson

(57) ABSTRACT

Methods and circuitry for reducing ground bounce and VCC sag effects in integrated circuit ("IC") devices is provided. In particular, a via-programmable design for I/O circuitry in IC devices is provided. The via-programmable I/O circuitry is used to disconnect I/O pin driver circuitry from and create a substantially direct connection between unused I/O pins and the ground and/or VCC signals of an IC device to reduce ground bounce and VCC sag, respectively.

30 Claims, 5 Drawing Sheets

US 7,514,952 B2

I/O CIRCUITRY FOR REDUCING GROUND BOUNCE AND VCC SAG IN INTEGRATED CIRCUIT DEVICES

BACKGROUND OF THE INVENTION

This invention relates generally to I/O circuitry in integrated circuit ("IC") devices. In particular, this invention relates to a via-programmable design for I/O circuitry in IC devices that reduces the amount of ground bounce and power (i.e., "VCC") sag of such devices.

Ground bounce and VCC sag are two well-known analog phenomena that are unavoidably encountered in the design of digital integrated circuit devices. Substantial ground bounce arises when the data signals on numerous active I/O pins on an IC device simultaneously switch from a logic 1 to a logic 0. Due to the sudden transition in the logic signals, a sudden rush of excess current (that was previously stored in the load capacitors of the I/O pins) flows from each of the I/O pins to the ground of the IC device. And since the return current path for the excess current includes several inductances (e.g., a bond wire/substrate inductance, a lead frame/pin inductance, and a board inductance), a voltage difference is generated between the IC device ground signal and the ground signal of the printed circuit board ("PCB") of the IC device, according to the relationship $V=L \times (di/dt)$. As the rush in current builds and recedes, then, the IC device ground signal bounces. VCC sag, on the other hand, refers to the opposite phenomenon that occurs when numerous active I/O pins switch simultaneously from a logic 0 to a logic 1. Specifically, the sudden rush of current into the I/O pins, coupled with the inductances of the associated current path from the VCC source of the IC device to the I/O pins, temporarily pulls down the device VCC signal.

The noise in IC devices caused by ground bounce and VCC sag have become more of a problem in modern semiconductor devices, which are characterized by ever-increasing clock speeds and numbers of I/O pins. Due to such aberrations in device ground and VCC signals, then, the integrity of I/O signals in such devices have been reduced, resulting in errors in data transmission.

There are currently various design methods and IC device features that are employed to address the problem of ground bounce and VCC sag. For example, ICs are commonly designed with less inductive types of device packaging, slower slew rates, delay circuitry to reduce the number of simultaneously switching I/O pins, and different termination schemes to reduce the amount of current flow caused by switching I/O pins. Also, IC designers tend to design IC devices that operate using, for example, synchronous timing and low-voltage differential signaling ("LVDS") to further limit the amount of ground bounce and VCC sag experienced by such devices. Despite these techniques, ground bounce and VCC sag continues to be a problem, especially in view of increasing clock speeds and numbers of I/O pins, and therefore IC designers continue to look for improvements that can be made in this area.

SUMMARY OF THE INVENTION

In accordance with the present invention, I/O circuitry with via-programmability is provided for reducing ground bounce and VCC sag in digital designs. In particular, programmable via sites are created around I/O pins so as to be able to programmably connect the I/O pins to an I/O driver, or to create a substantially direct connection between the I/O pins and a ground or power signal of an IC device. To reduce ground bounce, unused I/O pins are coupled to board ground signal corresponding the ground signal of the PCB of the IC device, and are then directly connected to a ground conductor carrying the device ground signal using a via connection. Similarly, to reduce VCC sag, unused I/O pins are coupled to a board VCC signal corresponding to the power signal of the PCB of the IC device, and are then directly connected to a power conductor power carrying the device power signal also by a via connection. The via connections each create a less inductive current path than the more conventional current path through the I/O driver. In addition, each via connection allows more return current from the other active I/O pins to flow to the unused I/O pins than would be allowed by current flowing across the I/O driver of an I/O pin. This design not only reduces the overall amount of ground bounce and VCC sag experienced by IC devices, but also has the added advantage of reducing the power consumed by I/O circuitry employing unused I/O pins to reduce these effects.

DETAILED DESCRIPTION OF THE PREFERRED EMBODIMENTS

Figure 1A:
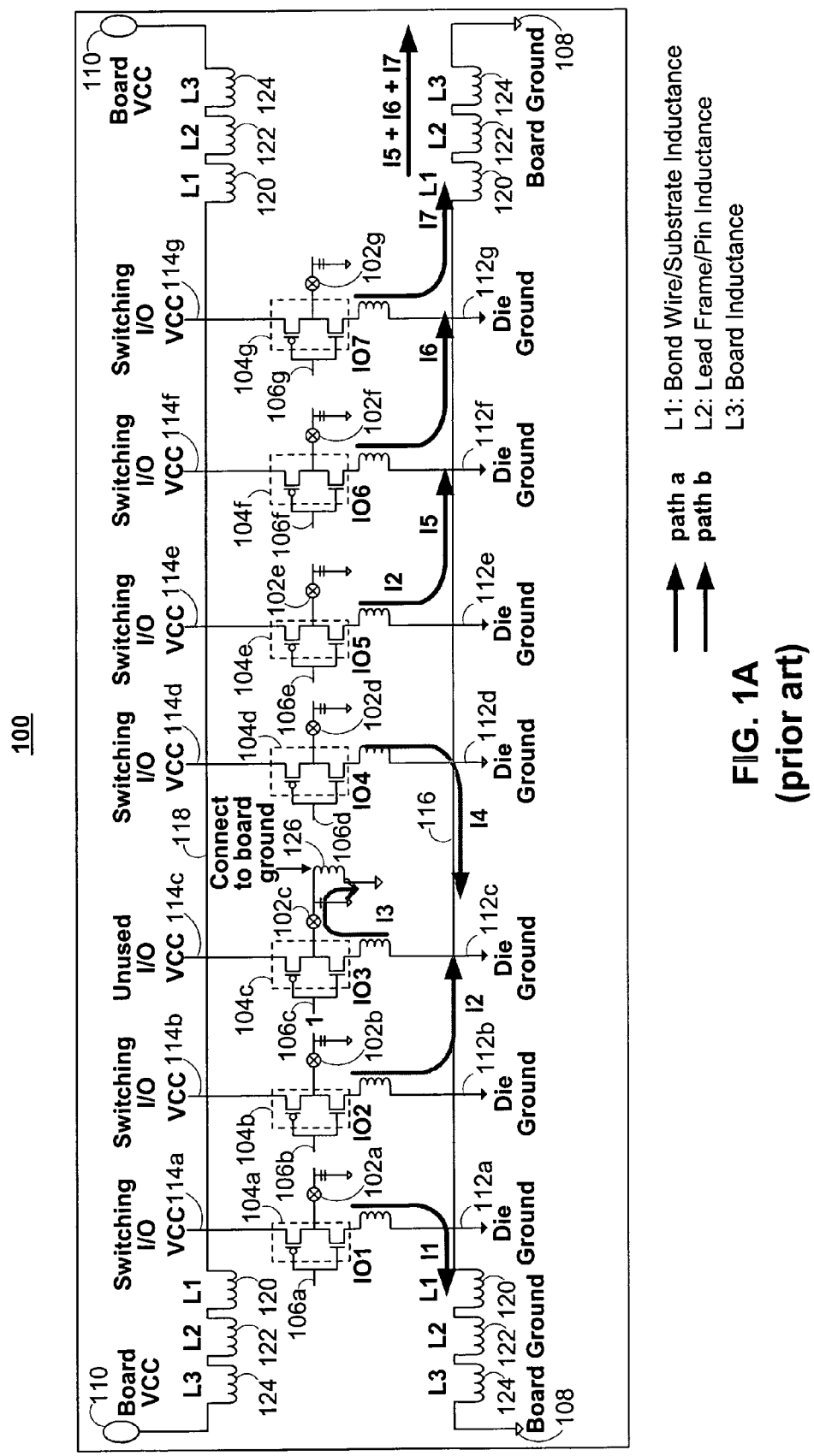
FIGS. 1A and 1B are illustrative circuit diagrams of prior art I/O circuitry in accordance with the present invention.
Figure 1B:
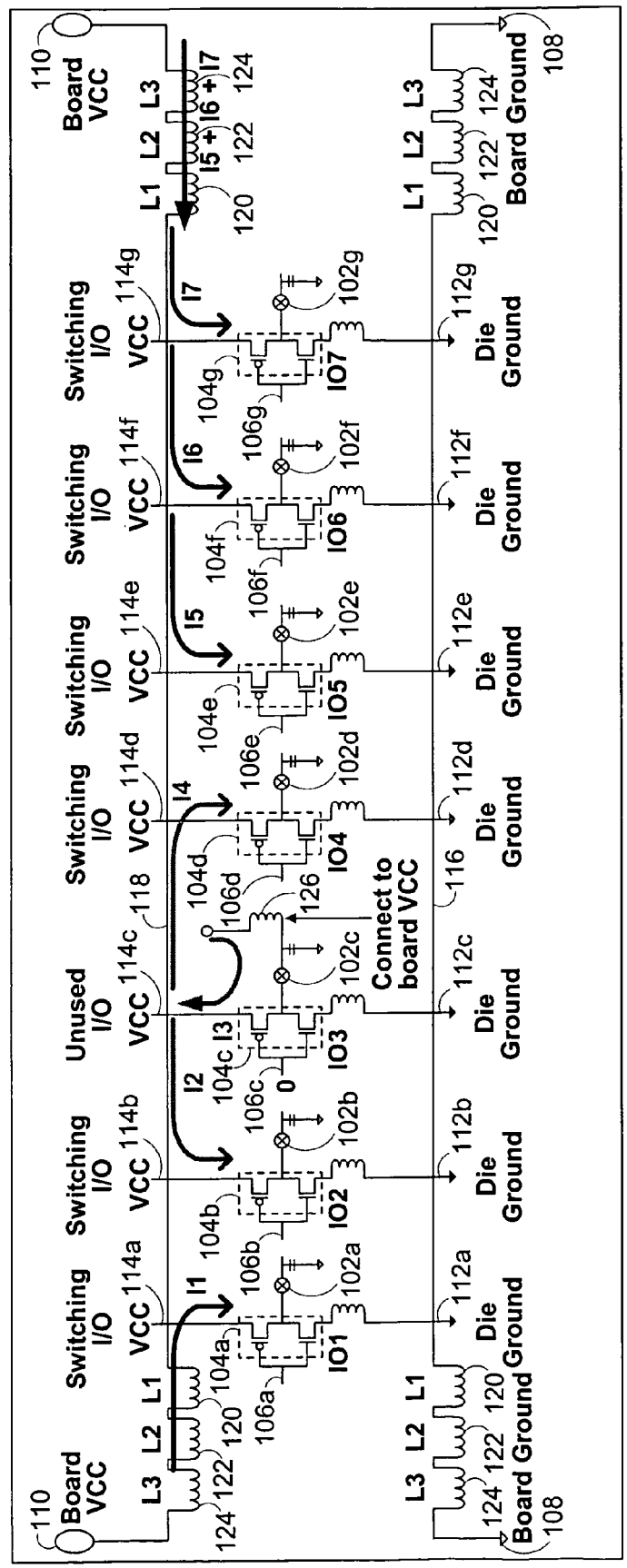

FIGS. 1A and 1B show an illustrative circuit for implementing a prior-art method for reducing ground bounce and VCC sag. In particular, FIGS. 1A and 1B show a series of seven I/O pins 102a-g of IC device 100. With the exception of I/O pin 102c, it is assumed that each of I/O pins 102a-g in FIGS. 1A and 1B is connected to an actively switching I/O data signal and is therefore being used. As a result, each of the used I/O pins is a source of ground bounce and VCC sag as previously described. I/O pin 102c is assumed to be unused for the purpose of illustrating the prior-art method for reducing ground bounce and VCC sag as will be seen below.

In FIGS. 1A and 1B, each of I/O pins 102a-g has an associated one of I/O drivers 104a-g (which may be implemented as a CMOS inverter as shown) that is used to help drive a logic signal on the corresponding I/O pin to board ground 108 or board VCC 110 depending on the logic state of the I/O pin. For instance, when the data signal connected to I/O pin 102a switches from a logic 1 to a logic 0, control signal 106a for I/O driver 104a transitions from a logic 0 to a logic 1. As a result, the PMOS transistor and NMOS transistor of I/O driver 104a are turned off and on, respectively, so as to drive the logic 0 signal on I/O pin 102a to board ground 108. Similarly, when the data signal connected to I/O pin 102a switches from a logic 0 to a logic 1, control signal 106a for I/O driver 104a transitions from a logic 1 to a logic 0. As a result, the PMOS transistor and NMOS transistor of I/O driver 104a are turned on and off, respectively, so as to drive the logic 1 signal on I/O pin 102b to board VCC 110. It will be understood that board ground 108 and board VCC 110 generally represent the board and power voltage of the printed circuit board on which IC device 100 is implemented.

In order to drive the I/O pin signals to board ground 108 and board VCC 110, each one of I/O pins 102a-g is connected to a corresponding local ground 112a-g (i.e., a device ground signal) and local VCC 114a-g (i.e., a device VCC signal).

Each device ground 112a-g is connected to board ground 108 by being connected to ground conductor 116, which is in turn coupled to board ground 108 via inductances 120, 122 and 124. Likewise, each device VCC 114a-g is connected to board VCC 110 by being connected to VCC conductor 118, which is in turn coupled to board VCC 110 via inductances 120, 122 and 124. Inductances 120, 122 and 124 may represent, for example, a bond wire/substrate inductance, a lead frame/pin inductance and a board inductance, or the like (such as are commonly found on similar IC devices). The presence of inductances 120, 122 and 124 therefore causes ground bounce or VCC sag to occur whenever the signal on any one of the used I/O pins in pins 102a-g switches from a logic 1 to a logic 0 or vice-versa. As previously described, the amount of ground bounce worsens, for example, when the logic signals on multiple used I/O pins simultaneously switch logic states.

According to the prior art method for reducing ground bounce or VCC sag in an IC device, unused I/O pins are utilized by connecting the unused pins to a board ground or a board VCC signal, and then the corresponding I/O drivers are activated so as to provide an alternative, less inductive path to the board ground or board VCC for nearby used I/O pins. For example, to reduce ground bounce, unused I/O pin 102c in FIG. 1A is connected to board ground and a logic 1 control signal 106c is sent to I/O driver 104c in order to couple I/O pin 102c to device ground 112c and to board ground 108. As a result, as shown in FIG. 1A, ground current (the current discharge due to the data signal on an active, used I/O pin transitioning from a logic 1 to a logic 0, as described above) from nearby pins such as I/O pins 102b and 102d that would otherwise flow to board ground 108 across inductances 120, 122 and 124 instead flows to board ground via unused I/O pin 102c. Although the current path to board ground through unused I/O pin 102c also has inductances associated with it (namely the intrinsic inductance associated with I/O driver 104c, plus inductance 126 corresponding to the connection of I/O pin 102c to board ground), the overall inductance due to this current path is substantially less than the combined inductances of 120, 122 and 124. Therefore, the total amount of ground bounce is reduced due to the ground current from a portion of the used I/O pins among pins 102a-g flowing across this less inductive path. Of course, the ground current from more than just I/O pins 102b and 102d could flow to board ground via the board ground connection created by unused I/O pin 102c. Whether the ground current flows from a particular one of the used I/O pins flows across inductances 120, 122 and 124 to board ground 108, or whether the current flows to the board ground via unused pin I/O 102c depends on whichever path has the least resistance.

Similarly, to reduce VCC sag, unused I/O pins are connected to a board VCC signal so as to provide a less inductive current path to the board VCC. For example, unused I/O pin 102c in FIG. 1B is connected to board VCC and a logic 0 control signal 106c is sent to I/O driver 104c in order to couple I/O pin 102c to device VCC 114c and to board VCC 110. As a result, some of the VCC current (the current that flows from the board VCC to an used I/O pin to charge the signal on the pin during a signal transition from a logic 0 and 1) that would otherwise flow from board VCC 110 and across inductances 120, 122 and 124 to the used I/O pins of pins 102a-g instead flows to the used I/O pins from the connection to board VCC via unused I/O pin 102c. The overall inductance of this alternative VCC current path is thus equal to the intrinsic inductance associated with I/O driver 104c and inductance 226 corresponding to the connection of I/O pin 102c to board VCC. Since this inductance is less than that of inductances 120, 122 and 124 combined, the total amount of VCC sag exhibited by IC device 100 is reduced.

Thus, it is seen from the prior art that unused I/O pins of IC devices can be coupled to board ground and to board VCC to reduce ground bounce and VCC sag. When there are multiple unused I/O pins, some of the unused I/O pins may be coupled to board ground, and the others may be coupled to board VCC in order to simultaneously reduce ground bounce and VCC sag. Collectively, the unused I/O pins may be coupled to board ground and board VCC in such a way so as maximize the reduction in ground bounce and VCC sag. For example, the unused I/O pins may be connected to board ground and board VCC in a substantially alternating manner so that the length of—and therefore the inductance associated with—the average current return path (from the used I/O pins to board ground or board VCC) is minimized.

One of the drawbacks of the prior art is that the amount of current that can flow across the unused I/O pins is limited by the drive strength of the driver circuitry (e.g., CMOS inverter 104c in FIGS. 1A and 1B) for those pins. For example, because of the restriction in current flow across I/O pin 102c in FIGS. 1A and 1B, the ground or VCC current from only I/O pins 102b and 102d may flow across I/O pin 102c. Meanwhile, the return ground or VCC current path from I/O pins 102a and 102e-102g may be substantially unaffected by the coupling of unused I/O pin 102c to board ground or board VCC, and may therefore still cause relatively large amounts of ground bounce and VCC sag as previously described. As a result, the overall reduction in ground bounce and VCC sag is likewise restricted.

FIGS. 2A, 2B and 3 illustrate I/O circuitry employing the techniques of the present invention for reducing ground bounce and VCC sag. Like elements between FIGS. 1A and 1B and FIGS. 2A, 2B and 3 have been numbered similarly. The present invention allows for an increased reduction in the amount of ground bounce and VCC sag through the implementation of I/O circuitry using via-programmable connections. The vias specifically enable unused I/O pins to be directly connected to board ground or board VCC, therefore lowering the inductance of the current path across the unused I/O pins and increasing the amount of current flow permitted across such pins.

Figure 2:
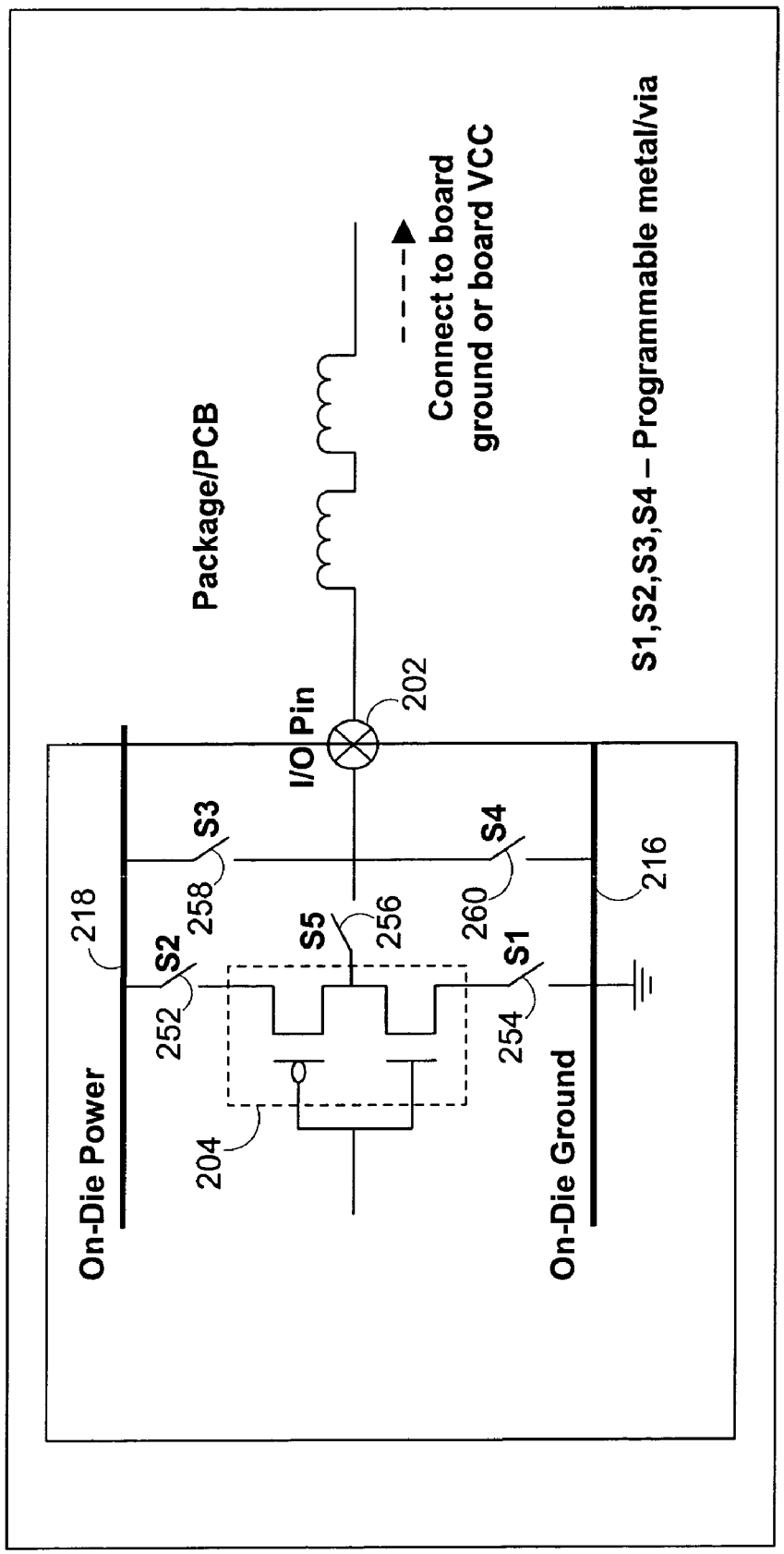
FIG. 2 is a detailed circuit diagram of the via-programmable I/O circuitry in accordance with the present invention.

FIG. 2 shows in more detail the vias that are created with respect to a single I/O pin 202 in accordance with the present invention. As FIG. 2 illustrates, five via sites are created for I/O pin 202. Vias 252 (S2), 254 (S1) and 256 (S5) are used to create programmable connections between I/O driver 204 and device VCC conductor 218, device ground conductor 216 and I/O pin 202, respectively. Vias 258 (S3) and 260 (S4) are similarly used to connect I/O pin 202 to device VCC conductor 218, and to device ground conductor 216, respectively. Connections at each of these via sites are either made or not made using programmable metal depending on the state of operation of the particular I/O pin, as will be seen below.

Figure 3A:
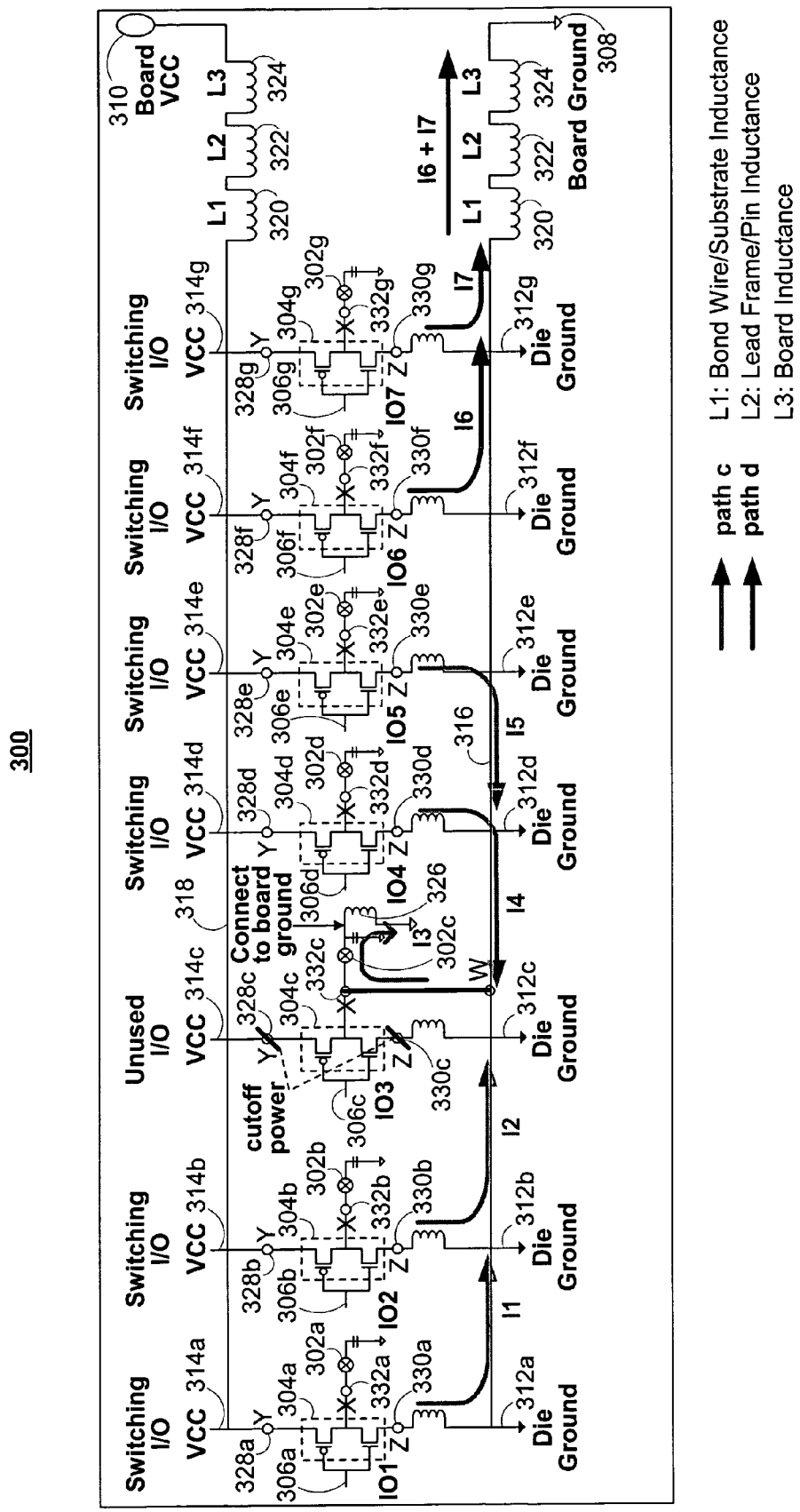
FIGS. 3A and 3B are circuit diagrams of the via-programmable I/O circuitry in accordance with the present invention.
Figure 3B:
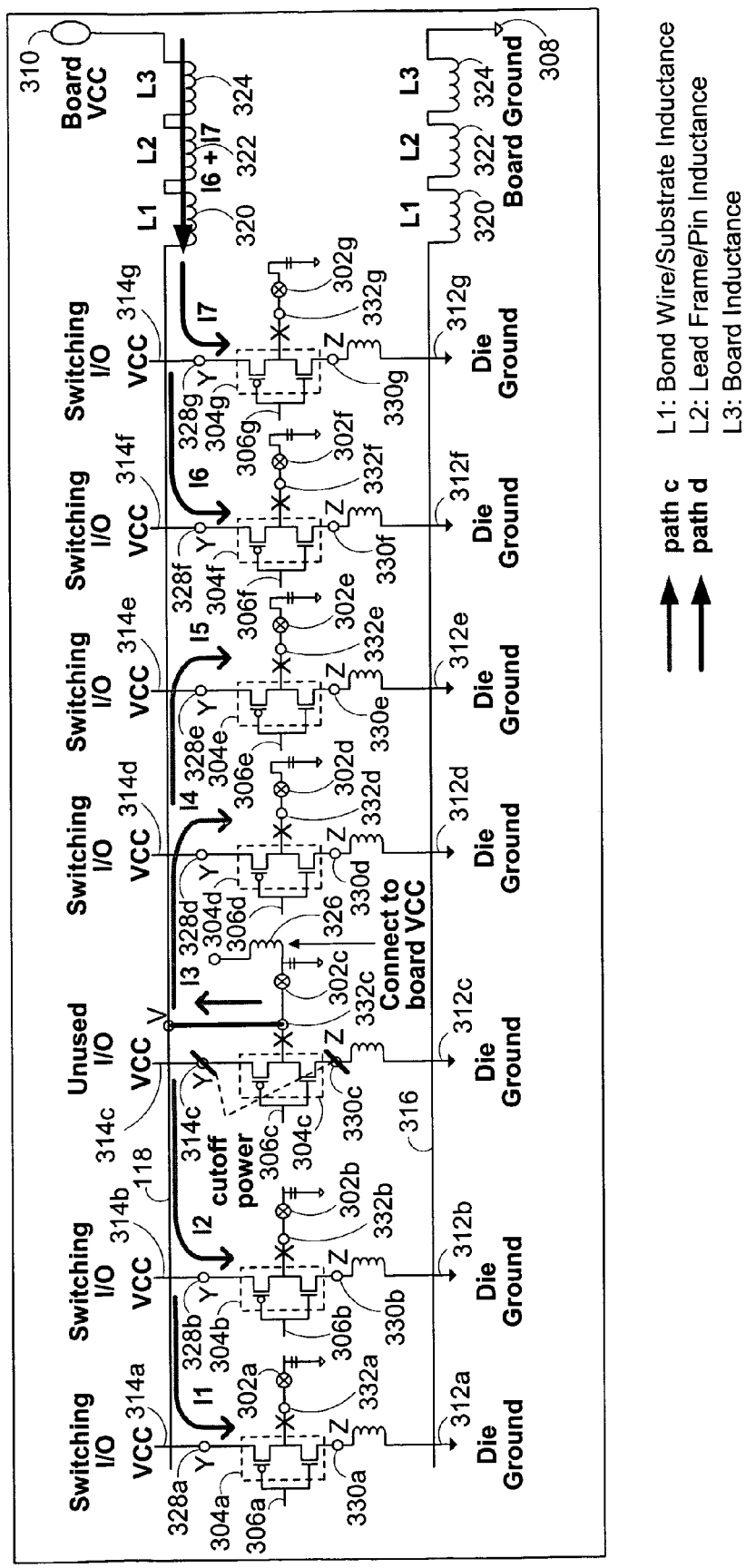

FIGS. 3A and 3B illustrate the method for connecting unused I/O pins to board ground and board VCC using the programmable via circuitry in accordance with the invention, in order to reduce ground bounce and VCC sag. Looking at FIG. 3A first, FIG. 3A shows six used I/O pins 302a, 302b and 302d-g, and a single unused I/O pin 302c. Although each of I/O pins 302a-302g has only three via sites shown in FIG. 3A (vias 328, 330 and 332), it will be understood that each of vias 328a-g in FIG. 3A corresponds to via 252 in FIG. 2, each of vias 330a-g in FIG. 3A corresponds to via 254 in FIG. 2, and each of vias 332a-g in FIG. 3A corresponds to the combination of vias 256, 258 and 260 in FIG. 2 (the same analysis applies for FIG. 3B, discussed below). Now, since I/O pins 302a, 302b and 302d-g are in use in FIG. 3A, vias 328a, 328b, 328d-g, 330a, 330b and 330d-g are connected, and vias 332a, 332b and 332d-g are each connected only to the corresponding I/O pin (i.e., the potential via connections to device ground conductor 316 and device VCC conductor 318 are left unconnected). As a result, the used I/O pins 302a, 302b and 302d-g are connected both to device ground conductor 316 and to device VCC conductor 318 through the associated one of I/O drivers 304a, 304b and 304d-g for normal operation. With unused I/O pin 302c, vias 328c and 330c are left unconnected while via 332c is connected only to device ground conductor 316 (i.e., the potential via connections to I/O driver 304c and device VCC conductor 318 are left unconnected). As a result, since unused I/O pin 302c is connected to device ground conductor 316 through via connection 332c rather than through I/O driver 304c, the inductance of the current path to board ground through I/O pin 302c is reduced, thus further lowering the overall amount of ground bounce associated with IC device 300. Also, because I/O driver 304c has effectively been disconnected, the current passing through I/O pin 302c is no longer limited by the drive strength of I/O driver 304c. Accordingly, ground current from more of the neighboring I/O pins (e.g., current from I/O pins 302a and 302e, in addition to current from I/O pins 302b and 302d) may flow to board ground through unused I/O pin 302c, thereby lowering the overall ground bounce further still.

FIG. 3B shows the method for connecting unused I/O pins of the present invention directly to device VCC conductor 318 of IC device 300 so as to improve the reduction in VCC sag. Like FIG. 3A, FIG. 3B shows six used I/O pins in pins 302a, 302b and 302d-g, and a single unused pin 302c. It will be understood that FIG. 3B is largely similar to FIG. 3A, with the exception that unused pin 302c is directly connected to device VCC conductor 318 instead of device ground conductor 316. In particular, like in FIG. 3A, vias 328a, 328b, 328d-g, 330a, 330b and 330d-g of used I/O pins 302a, 302b and 302d-g are connected, and vias 332a, 332b and 332d-g of used I/O pins 302a, 302b and 302d-g are each connected only to the corresponding I/O pin, so as to connect the I/O pins to board ground and board VCC through the I/O drivers. Meanwhile, vias 328c and 330c of unused I/O pin 302c are left unconnected in order to disconnect I/O driver 304c, and via 332c of unused I/O pin 302c is connected only to device VCC conductor 318, thus establishing a direct connection between the unused I/O pin and board power. As a result, the inductance of the current path to board VCC across unused I/O pin 302c is decreased, and the amount of allowable current flow across I/O pin 302c is increased, thereby lowering overall VCC sag.

Thus, through providing I/O circuitry with via-programmability, the present invention reduces the amount of ground bounce and VCC sag of an IC device by reducing the inductance and increasing the current flow associated with the current path to board ground or board VCC via unused I/O pins. Specifically, the amount of current flow across the unused I/O pins are no longer limited by the characteristics of the I/O driver circuitry (e.g., the silicon diffusion layer of a CMOS inverter) associated with I/O pin, but are rather a function of the physical width of the via and the number of vias that are used to make each connection. For added current flow, multiple via sites may be used to connect the I/O pin to board ground or board VCC.

One of ordinary skill in the art will readily appreciate the advantages of the present invention. By reducing ground bounce and VCC sag, the invention boosts the integrity of data signals transmitted to and from IC devices. As a result, the probability of error in the transmission of data is decreased, thereby allowing such data to be transmitted at even higher clock speeds. Also, the invention demonstrates improved power consumption, since the I/O drivers for unused I/O pins are no longer used and therefore do not need to be powered.

Furthermore, it will be understood that the techniques of the present invention are not limited to a via implementation. For example, one of ordinary skill in the art will appreciate that the techniques described hereinabove for lowering ground bounce and VCC sag can be implemented simply using metal layers. The metal layers may therefore be used to form the above-described connections from an I/O pin either directly to board ground and board VCC, or from the I/O pin to broad ground and board VCC through an I/O driver, on the basis of whether the I/O pin is used or not. More generally, it will be understood that any type of mask-programmable interconnection circuitry may be used to achieve the present invention.

IC device 300 may represent any one of a number of different types of integrated circuit devices with I/O circuitry as described hereinabove. For instance, IC device 300 may be a programmable logic device ("PLD"), an application-specific integrated circuit ("ASIC") device (e.g., a structured ASIC design that has been converted from a field-programmable gate array ("FPGA") design), etc.

It will be understood, therefore, that the foregoing is only illustrative of the principles of the invention, and that various modifications can be made by those skilled in the art without departing from the scope and spirit of the invention, and that the present invention is limited only by the claims that follow.

What is claimed is:

1. A method for use with an integrated circuit device comprising at least one unused input/output pin, the method comprising:
   directly connecting the unused input/output pin to one of a board ground signal and a board power signal, wherein the board ground signal and the board power signal correspond, respectively, to a ground signal and a power signal of a printed circuit board on which the integrated circuit device is implemented; and
   creating a substantially direct and permanent connection between the unused input/output pin and one of a device ground signal and a device power signal using programmable interconnection circuitry to reduce ground bounce or VCC sag associated with the integrated circuit device, wherein the device ground signal and the device power signal correspond, respectively, to a ground signal and a power signal of the integrated circuit device.

2. The method defined in claim 1 wherein the substantially direct connection is created between the unused input/output pin and the device ground signal when the unused input/output pin is coupled to the board ground signal, and wherein the substantially direct connection is created between the unused input/output pin and the device power signal when the unused input/output pin is coupled to the board power signal.

3. The method defined in claim 1 further comprising:
   disconnecting input/output driver circuitry for the unused input/output pin using the programmable interconnection circuitry.

4. The method defined in claim 3 wherein the disconnecting the input/output driver circuitry comprises disconnecting the input/output driver circuitry from the device ground signal, the device power signal, and the unused input/output pin using the programmable interconnection circuitry.

5. The method defined in claim 3 wherein the input/output driver circuitry comprises an inverter.

6. The method defined in claim 1 wherein the creating the substantially direct connection comprises creating a substantially direct connection between the unused input/output pin and one of a device ground conductor and a device power conductor.

7. The method defined in claim 1 further comprising:
connecting input/output driver circuitry to at least one used input/output pin using the programmable interconnection circuitry.

8. The method defined in claim 7 wherein the connecting the input/output driver circuitry comprises connecting the input/output driver circuitry to the device ground signal, the device power signal, and the used input/output pin using the programmable interconnection circuitry.

9. The method defined in claim 1 wherein the integrated circuit device comprises a plurality of unused input/output pins, and wherein the method is performed on each of the plurality of unused input/output pins in a substantially alternating manner.

10. The method defined in claim 1 wherein the programmable interconnection circuitry comprises via-programmable circuitry.

11. The method defined in claim 1 wherein the programmable interconnection circuitry comprises metal layers.

12. The method defined in claim 1 wherein the programmable interconnection circuitry comprises mask-programmable circuitry.

13. The method defined in claim 1 wherein the integrated circuit device comprises a programmable logic device.

14. The method defined in claim 1 wherein the integrated circuit device comprises an application-specific integrated circuit device.

15. A method for use with an integrated circuit device comprising at least one unused input/output pin, the method comprising:
directly connecting the unused input/output pin to one of a board ground signal and a board power signal, wherein the board ground signal and the board power signal correspond, respectively, to a ground signal and a power signal of a printed circuit board on which the integrated circuit device is implemented; and
creating a substantially direct and permanent connection between the unused input/output pin and one of a device ground signal and a device power signal using programmable interconnection circuitry to reduce ground bounce or VCC sag associated with the integrated circuit device, wherein:
the device ground signal and the device power signal correspond, respectively, to a ground signal and a power signal of the integrated circuit device; and
the method is performed during a conversion of the integrated circuit device from that of a field-programmable gate array device to that of an application-specific integrated circuit device.

16. Circuitry disposed within an integrated circuit device, the circuitry comprising:
at least one unused input/output pin that is directly connected to one of a board ground signal and a board power signal, wherein the board ground signal and the board power signal correspond, respectively, to a ground signal and a power signal of a printed circuit board on which the integrated circuit device is implemented; and
programmable interconnection circuitry that is used to create a substantially direct and permanent connection between the unused input/output pin and one of a device ground signal and a device power signal and reduce ground bounce or VCC sag associated with the integrated circuit device, wherein the device ground signal and the device power signal correspond, respectively, to a ground signal and a power signal of the integrated circuit device.

17. The circuitry defined in claim 16 wherein the substantially direct connection is created between the unused input/output pin and the device ground signal when the unused input/output pin is coupled to the board ground signal, and wherein the substantially direct connection is created between the unused input/output pin and the device power signal when the unused input/output pin is coupled to the board power signal.

18. The circuitry defined in claim 16 wherein the programmable interconnection circuitry is further used to disconnect input/output driver circuitry from the unused input/output pin.

19. The circuitry defined in claim 18 wherein the programmable interconnection circuitry is further used to disconnect the input/output driver circuitry from the device ground signal and the device power signal using the programmable interconnection circuitry.

20. The circuitry defined in claim 18 wherein the input/output driver circuitry comprises an inverter.

21. The circuitry defined in claim 16 wherein the programmable interconnection circuitry is used to create the substantially direct connection between the unused input/output pin and one of the device ground signal and the device power signal by creating a substantially direct connection between the unused input/output pin and one of a device ground conductor and a device power conductor.

22. The circuitry defined in claim 16 wherein the programmable interconnection circuitry is further used to connect input/output driver circuitry to at least one used input/output pin.

23. The circuitry defined in claim 22 wherein the programmable interconnection circuitry is further used to connect the input/output driver circuitry to the device ground signal and the device power signal.

24. The circuitry defined in claim 16 wherein the integrated circuit device comprises a plurality of unused input/output pins, and wherein each of the unused input/output pins are coupled to one of the board ground signal and the board power signal, and connected substantially directly to one of the device ground signal and the device power signal using the programmable interconnection circuitry, in a substantially alternating manner.

25. The circuitry defined in claim 16 wherein the programmable interconnection circuitry comprises via-programmable circuitry.

26. The circuitry defined in claim 16 wherein the programmable interconnection circuitry comprises metal layers.

27. The circuitry defined in claim 16 wherein the programmable interconnection circuitry comprises mask-programmable circuitry.

28. The circuitry defined in claim 16 wherein the integrated circuit device comprises a programmable logic device.

29. The circuitry defined in claim 16 wherein the integrated circuit device comprises an application-specific integrated circuit device.

30. Circuitry disposed within an integrated circuit device, the circuitry comprising:
at least one unused input/output pin that is directly connected to one of a board ground signal and a board power signal, wherein the board ground signal and the board power signal correspond, respectively, to a ground signal and a power signal of a printed circuit board on which the integrated circuit device is implemented; and programmable interconnection circuitry that is used to create a substantially direct and permanent connection between the unused input/output pin and one of a device ground signal and a device power signal and reduce ground bounce or VCC sag associated with the integrated circuit device, wherein:

the device ground signal and the device power signal correspond, respectively, to a ground signal and a power signal of the integrated circuit device; and the integrated circuit device comprises an application-specific integrated circuit device design that has been converted from a field-programmable gate array device design.

\* \* \* \* \*